United States Patent [19]
Mundigl

[11] Patent Number: 6,112,406
[45] Date of Patent: Sep. 5, 2000

[54] METHOD FOR PRODUCING ELECTRICALLY CONDUCTIVE CONNECTIONS BETWEEN TWO OR MORE CONDUCTOR STRUCTURES

[75] Inventor: Josef Mundigl, Duggendorf, Germany

[73] Assignee: Siemens Aktiengesellschaft, Munich, Germany

[21] Appl. No.: 09/188,047

[22] Filed: Nov. 6, 1998

Related U.S. Application Data

[63] Continuation of application No. PCT/DE97/00871, Apr. 29, 1997.

[30] Foreign Application Priority Data

May 6, 1996 [DE] Germany ............................ 196 18 099

[51] Int. Cl.⁷ .................................................... H05K 3/30
[52] U.S. Cl. .............................. 29/832; 29/825; 29/840
[58] Field of Search ............................. 29/827, 840, 832, 29/841, 834, 825

[56] References Cited

U.S. PATENT DOCUMENTS

| | | | |
|---|---|---|---|
| 4,373,259 | 2/1983 | Motsch | 29/840 |
| 5,092,032 | 3/1992 | Murakami | 29/832 X |
| 5,147,210 | 9/1992 | Patterson et al. | 29/832 X |
| 5,371,407 | 12/1994 | Goldman | 29/832 X |

FOREIGN PATENT DOCUMENTS

| | | |
|---|---|---|
| 0 450 470 A2 | 10/1991 | European Pat. Off. . |
| 0 567 814 A1 | 11/1993 | European Pat. Off. . |
| 1 951 778 | 5/1971 | Germany . |
| 43 19 876 A1 | 9/1994 | Germany . |
| 43 27 560 A1 | 2/1995 | Germany . |
| 43 37 920 A1 | 5/1995 | Germany . |

OTHER PUBLICATIONS

"System Integration of Liquid Crystal–Indicator Modules" (Boll et al.), F&M 102, 1994, pp. 605–608.
German Published Application No. 63/2854, dated Sep. 23, 1963, carrier plate according to the printed circuit with metal conductor strips provided in several planes which are in part electrically interconnected.
IBM Tech Discl Bull vol. 15 No. 2 Jul. 1972 p. 420 (by Abolafia).
IBM Tech Discl Bull vol. 33 No. 10A Mar. 1991 pp. 450–451.
IBM Tech Discl Bull vol. 34 No. 12 May 1992 pp. 1–2.

*Primary Examiner*—Carl J. Arbes
*Attorney, Agent, or Firm*—Herbert L. Lerner; Laurence A. Greenberg; Werner H. Stemer

[57] ABSTRACT

A method for producing at least one electrically conductive connection between two or more conductor structures in which at least one of the conductor structures is connected to a carrier to form a composite conductor system. At least one of the composite conductor systems has perforations in the region of contact points of the conductor structure. The connection is made in the region of the perforations by supplying thermal energy or by introducing an electrically conductive mass. Electrically conductive connections can be made between a plurality of conductor structures in a simple and cost-effective way which avoids damage to even thermosensitive thermoplastic carriers.

10 Claims, 4 Drawing Sheets

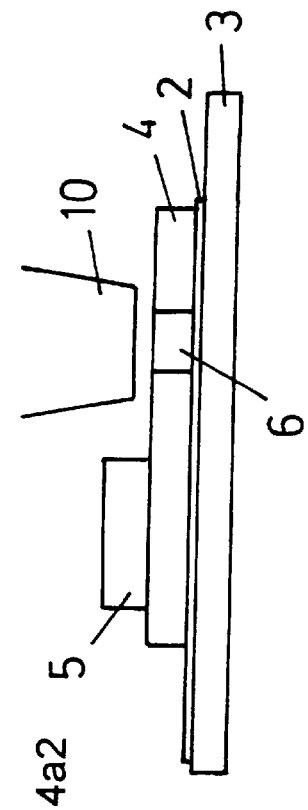
Fig. 4a1
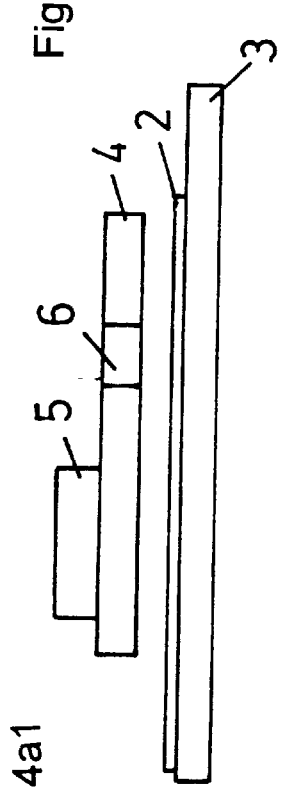
Fig. 4a2
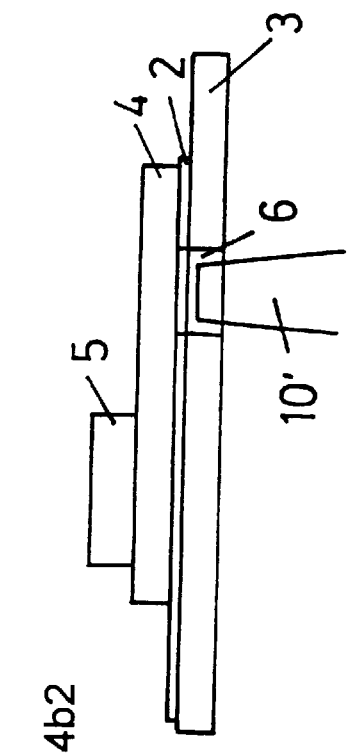
Fig. 4b1
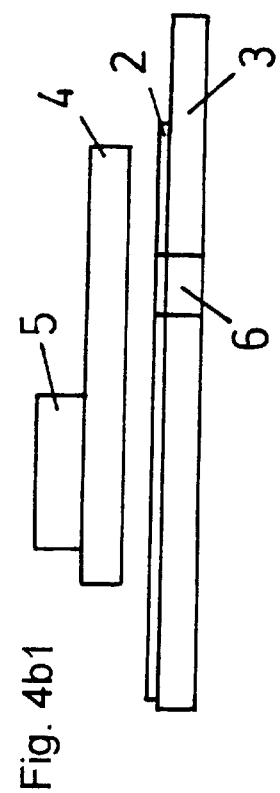
Fig. 4b2
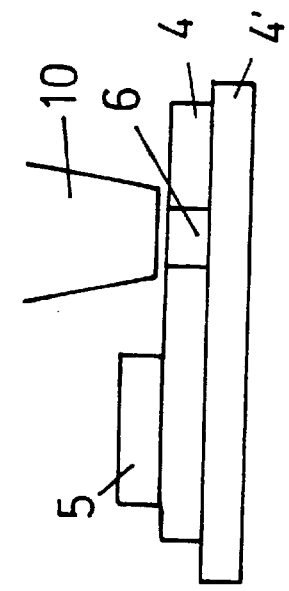
Fig. 4c1
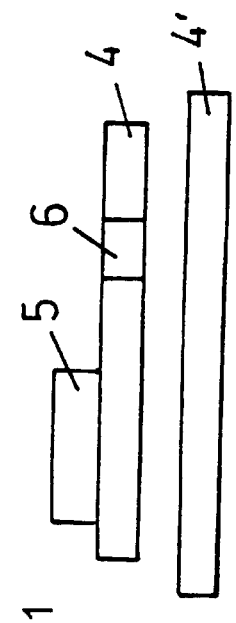
Fig. 4c2

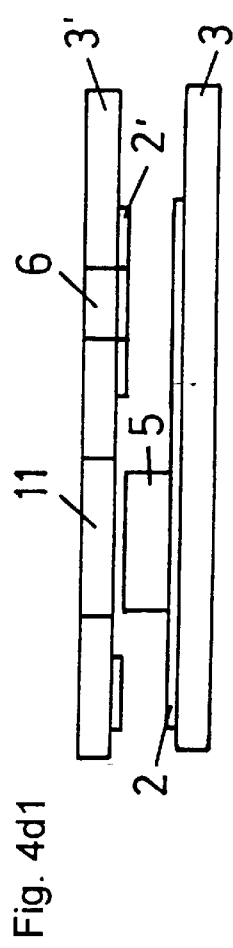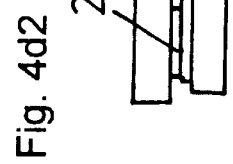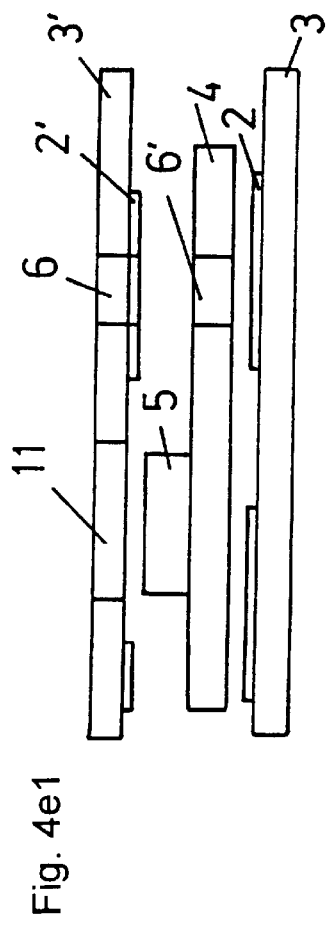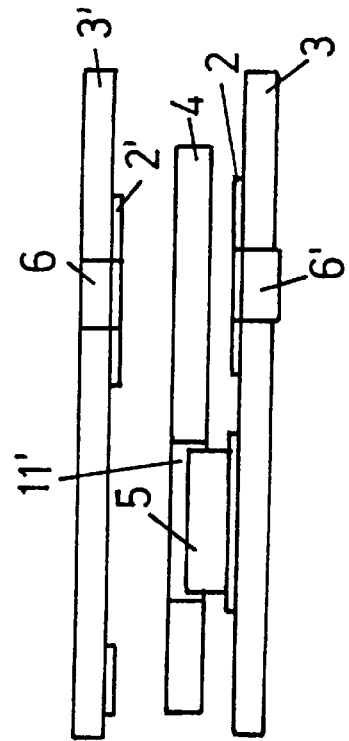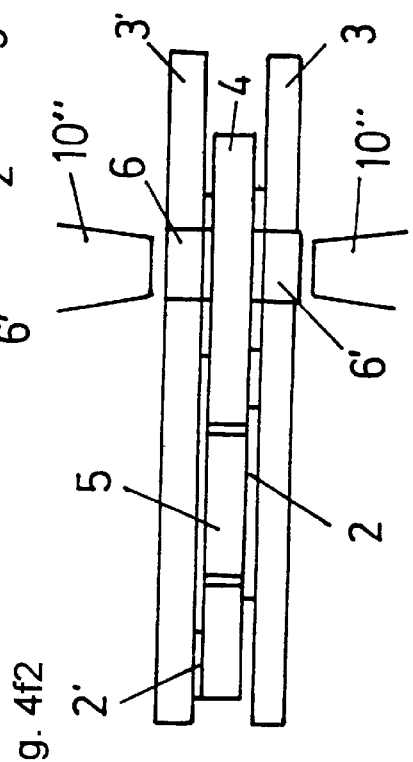

METHOD FOR PRODUCING ELECTRICALLY CONDUCTIVE CONNECTIONS BETWEEN TWO OR MORE CONDUCTOR STRUCTURES

CROSS-REFERENCE TO RELATED APPLICATION

This application is a continuation of copending International Application No. PCT/DE97/00871, filed on Apr. 29, 1997, which designated the United States.

BACKGROUND OF THE INVENTION

FIELD OF THE INVENTION

The invention relates to a method for producing partial electrically conductive contact connections between two conductor structures and, in particular, between two conductor structures, at least one of which is applied to a stabilizing carrier.

The term conductor structure is meant to include any kind of conductive structure, that is to say, in principle, any electrically conductive component, such as, for example, the electrical contacts of SMD and IC modules or the like. In particular, the term embraces conductive structures worked out from metal layers or metal foils and, above all, circuits worked out from conductive foils. The conductive foils may, for example, have a thickness of 12–200 µm or even more.

The conductive structures may be vapor-deposited, adhesively bonded or applied in another known way to a carrier or they may be integrated into the carrier for mechanical reinforcement and insulation. Systems of that type are referred to below as composite conductor systems. Plastics and, in particular, thermoplastics, such as polyimides, polyesters, polyolefins, halogenated polyolefins, if appropriate reinforced polyepoxys and copolymerides or graft polymerides of those polymers, inter alia, are suitable as carriers. The conductor structures may also be surface-treated or surface-refined to improve corrosion protection.

However, problems arise when the conductive connections are made between the conductor structures, especially in the case of multi-layer structures of that type with two or more conductor structures, at least one of which is located on a thermoplastic carrier. Thermal methods present difficulties, since the thermoplastic carrier melts under the effective heat, at least in the region of the direct heat effect. The global introduction of heat (in a furnace, etc.) consequently cannot be employed: Methods with the local input of heat and short-term control are preferred (for example, IR, laser, hot-air methods with a thin nozzle, thermocompression methods, resistance methods, gap soldering rod methods, etc.). The difficulties are particularly serious if a conductor structure applied to a thermoplastic carrier is to be connected conductively to a larger and/or thicker composite conductor system. Those may, for example, be composite conductor systems with carrier foils for SMD modules or for metallic junction frames (leadframes) with at least one integrated IC module. The carrier foils are normally relatively thick and sheet-like in that case. If the thermal energy for making the conductive connection is supplied from the side of the thermoplastic carrier, the energy has to be conducted through the carrier and causes the latter to melt. If the thermal energy is supplied from the other side, that is to say, for example, through a leadframe carrier, a considerable part of the energy being supplied is dissipated through the leadframe which, as a rule, is formed of highly heat-conductive metal. On one hand, that increases the energy consumption necessary for making the conductive connection, and on the other hand the dissipation of heat causes the carrier to heat up in the region around the connecting point. Particularly where a thermoplastic carrier is used, in most cases it melts to such an extent that the multi-layer structure can no longer be used due to deformation or destruction.

Thermal methods can therefore only be employed to a very limited extent or not at all for making the conductive connections. If thermal methods, such as welding, soldering, ultrasonic, thermocompression, thermosonic or laser methods, have been employed at all heretofore for connecting conductor structures to form multi-layer structures which include at least one thermoplastic carrier, it has been only with various restrictions. Either complicated restructuring and new dimensioning of the contact points were carried out or the thermoplastic carriers were replaced by other and more expensive materials. Another possibility was to keep the temperature input low, in order to prevent the thermoplastic material from being damaged. However, that led to a reduction in the strength of the connection being achieved.

Published European Patent Application 0 450 470 A2 describes a generic method for producing electrically conductive connections between two conductor structures, which are respectively connected to a carrier of thermoplastic synthetic material. The composite conductor systems have openings in the region of the contact points of the conductor structures. The composite conductor systems are, for example, heated in a heat press in order to produce electrically conductive connections. That method is related to the known disadvantages.

SUMMARY OF THE INVENTION

It is accordingly an object of the invention to provide a method for producing electrically conductive connections between two or more conductor structures, which overcomes the hereinafore-mentioned disadvantages of the heretofore-known methods of this general type, which, in particular, is thermal or thermally assisted, is simple and cost-effective and is as stable as possible. The method should largely prevent a carrier supporting one or both conductor structures from being damaged. Moreover, the method should require as low an energy outlay as possible.

With the foregoing and other objects in view there is provided, in accordance with the invention, a method for producing at least one electrically conductive connection between at least two conductor structures, at least one of the conductor structures connected to at least one carrier to form at least one composite conductor system, the at least one carrier formed of thermoplastic synthetic material, and the at least one composite conductor system having perforations formed therein in the vicinity of contact points of the conductor structure, which comprises directly supplying thermal energy directed or aimed through the perforations for producing the electrically conductive connection at the contact points.

The perforations permit direct access to the actual connection point and allow the connection to be made there in a controlled manner.

In accordance with another mode of the invention, the connection produced by the supply of thermal energy can be made, for example, by heat radiation, welding, soldering, thermocompression, through the use of ultrasonics, by laser or thermosonic methods. Preferred welding methods are spot, gap or close welding.

In accordance with a further mode of the invention, an electrically conductive mass is introduced into the perforations.

In accordance with an added mode of the invention, the electrically conductive mass can, for example, be a conductive paste, a conductive adhesive, a solder paste or a solder foil. Preferably, thermal energy is additionally supplied to the connecting point and, in principle, one of the above-mentioned methods may be employed. The method is selected according to the choice of the foil carrier, of the additive and of the partners to be connected and should be reduced to a minimum effective duration as a function of the materials involved. Subsequent or process-accompanying cooling of the thermoplastic substrate carrier is recommended.

Since direct access to the connecting points or locations is made possible by the perforations in the composite conductor system, it is possible for the connection between two conductor systems to be made in a very simple way. The problems of the prior art in the use of thermal or thermally assisted methods are largely avoided by the present invention. Thus, for example, the thermal energy no longer has to be conducted through a carrier, but can be supplied to the connecting point directly and in an controlled manner. This, on one hand, saves energy and, on the other hand, largely avoids the uncontrolled melting of the carrier.

In accordance with an additional mode of the invention, carriers with low melting points can be used without difficulty. For example, cost-effective thermoplastic carriers (made of PVC, PE, PET, PEN, PP, ABS or the like) may be readily employed and are also advantageous from the point of view of waste disposal or recycling.

In accordance with yet another mode of the invention, conductive connections are made to relatively thick composite conductor systems, such as, for example, leadframe foils. Since the thermal energy can be supplied to the connecting point in a controlled manner according to the invention, the heating-up of the metallic leadframe can be largely avoided and the diversion of heat into the carrier and the melting of the latter are not observed in practice.

With the objects of the invention in view, there is also provided a method for producing an electrically conductive connection between a metallic leadframe integrated into a foil and at least one conductor structure disposed on a thermoplastic carrier to form at least one composite conductor system having perforations formed therein in the vicinity of contact points of the conductor structure, which comprises directly supplying thermal energy directed through the perforations for producing the electrically conductive connection at the contact points.

Other features which are considered as characteristic for the invention are set forth in the appended claims.

Although the invention is illustrated and described herein as embodied in a method for producing electrically conductive connections between two or more conductor structures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 4a1 to 4f2 are cross-sectional views showing various multi-layer systems, in which FIGS. 4a1, 4b1, 4c1, 4d1, 4e1 and 4f1 are shown as individual components and FIGS. 4a2, 4b2, 4c2, 4d2, 4e2 and 4f2 are shown as composite structures, with possible connection technique being illustrated diagrammatically.

DESCRIPTION Of THE PREFERRED EMBODIMENTS

Figure 1:
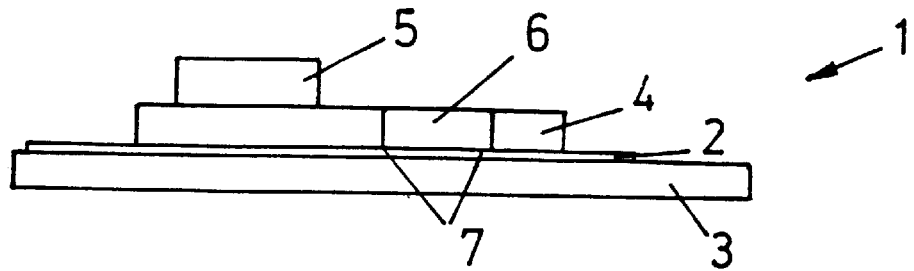
FIG. 1 is a diagrammatic, cross-sectional view showing the structure of a multi-layer system, to which the method according to the invention may be applied.

Referring now to the figures of the drawings in detail and first, particularly, to FIG. 1 thereof, there is seen, in particular, a diagrammatic illustration of a possible multi-layer system, to which the method according to the invention may be applied. In the instance shown, the multi-layer system 1 is composed of two composite conductor systems, namely, on one hand, a conductor structure 2 which is disposed on a carrier 3 and, on the other hand, a so-called leadframe foil 4, into which a non-illustrated metallic leadframe is integrated. An IC or SMD module 5 is disposed on the leadframe foil 4.

This configuration is merely an example. In principle, the invention is suitable for the connection of all conductor structures, at least one of which is combined with a carrier to form a composite conductor system.

According to the invention, at least one of the composite conductor systems present in the multi-layer system is provided with perforations. The perforations are located in the region of contact points or locations of the conductor structure in the composite conductor system. FIG. 1 shows a perforation which is designated by reference numeral 6. The perforation permits direct access to the connecting point. When thermal energy is supplied in order to make the connection, the formation of the connection first takes place in the region of points denoted by reference numeral 7.

The size of the perforations is expediently 0.3 to 1.5 mm in diameter in the case of a substrate thickness of 50 $\mu$m to 1000 $\mu$m or more. The perforations are dependent on the method, the materials used and their dimensions as well as the choice of the connection technique (soldering, welding, adhesive bonding, etc.).

Figure 2:
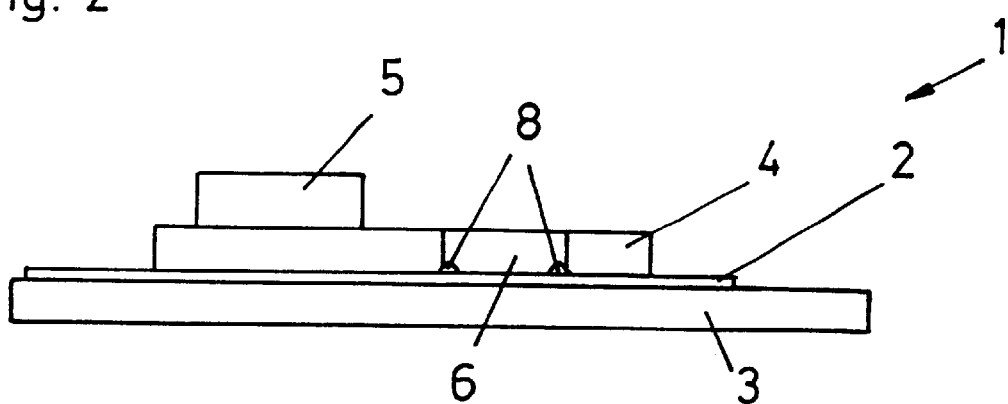
FIG. 2 is a cross-sectional view of the multi-layer system according to FIG. 1 with connections made.

FIG. 2 shows the multi-layer structure according to FIG. 1 with connections made thermally. Melting points which have occurred as a result of the supply of thermal energy are designated by reference numeral 8.

Figure 3:
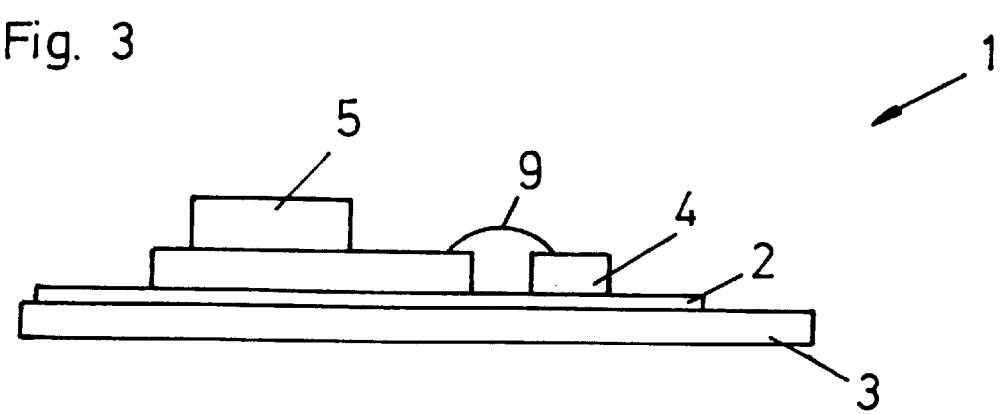
FIG. 3 is a cross-sectional view of the multi-layer system according to FIG. 1 showing another possible way of making the connections.

FIG. 3 shows the multi-layer system according to FIG. 1, in which the connections have been made through the use of an electrically conductive mass, for example a solder or a conductive paste. The conductive mass which is inserted into the perforation is designated by reference numeral 9.

Figure 5:
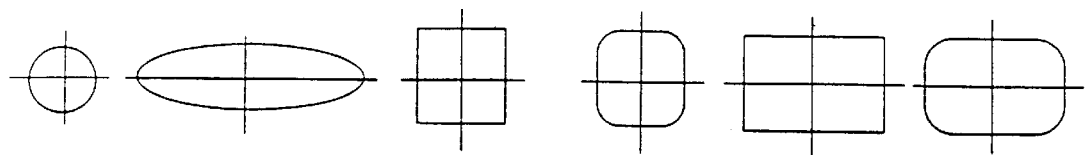
FIG. 5 is a top-plan view showing exemplary forms of the perforations according to the invention in the composite conductor system.

The perforations 6 may be produced in a wide variety of ways. For example, they may be punched in, stamped in, cut or sawn in, milled in, melted in, etched, printed or made in another way. The form and size of the perforations depend on the respective structure of the composite conductor system and its planned use. Perforations having a circular cross-section are preferred due to simple production. In principle, however, the perforations may have any desired cross-sectional form, that is to say they may, for example, be square, rectangular, polygonal, oval, etc. Elongate forms may be advantageous for sheet-like connection structures. The corners of the perforations may be rounded. Exemplary cross-sectional forms of the perforations are shown in FIG. 5.

FIGS. 4a1 to 4f2 diagrammatically illustrate some further multilayer structures which can be connected through the use of the method according to the invention. In each case, the unconnected individual components can be seen on the left-hand side in FIGS. 4a1 to 4f1, while the corresponding multi-layer structures and the production of the connections are illustrated diagrammatically on the right-hand side in FIGS. 4a2 to 4f2.

The system illustrated in FIG. 4a1 corresponds to that of FIGS. 1 to 3. In FIG. 4a2, reference numeral 10 designates a device for the supply of thermal energy. This may, for example, be an ultrasonic and/or thermocompression electrode or any other device through the use of which thermal energy can be supplied in the way already described.

The advantage of this system in comparison with the methods of the prior art is that the energy can be supplied to the desired connecting point in a controlled and locally limited manner. The thermal energy does not have to first pass through a carrier, nor is there a risk that relatively large quantities of energy will be diverted through the leadframe in the leadframe foil 4 and that the foil will begin to melt. Therefore, according to the invention, even thermo-sensitive carrier materials, such as thermoplastics, may be used, without them being damaged when the conductive connection is made.

FIGS. 4b1 and 4b2 show an alternative possibility for connecting a leadframe foil 4 to a composite conductor system including a carrier foil 3 and a conductor structure 2. Instead of forming the perforation in the leadframe foil, the perforation is formed in the lower of the two composite conductor systems, that is to say in the carrier foil 3 and the conductor structure 2. In a multi-layer system with two or more composite conductor systems, the thickest of the composite conductor systems is preferably perforated. Reference numeral 10' designates a device for the supply of thermal energy, for example a device for the supply of laser or IR radiation.

FIGS. 4c1 and 4c2 illustrate a multi-layer system, in which two leadframe foils 4 and 4' are connected to one another. The perforation 6 is located in the upper of the composite conductor systems. Thermal energy is supplied by a device 10.

FIGS. 4d1 and 4d2 show a multi-layer system including two composite conductor systems in each case having a conductor structure 2 or 2' and a carrier 3 or 3'. An IC or SMD module 5 is disposed on the lower of the two composite conductor systems. The upper composite conductor system 2', 3' has a passage orifice 11 for the IC or SMD module, in addition to the orifice 6. Thermal energy is supplied by a device 10''.

In the structure according to FIGS. 4e1 and 4e2, a leadframe foil 4 having an attached IC or SMD module 5 is pushed in between two composite conductor systems which correspond essentially to those of FIG. 4d1 and 4d2. In this case, the perforation 6, 6' extends through the upper composite conductor system 2', 3' and the leadframe foil 4. Thermal energy is supplied by a device 10''.

Another possibility is shown in FIGS. 4f1 and 4f2. In this case, on one hand, the IC or SMD module 5 is disposed on the lower composite conductor system and a corresponding orifice 11' is provided in the leadframe foil 4. The perforations 6, 6' are located in the upper and lower composite conductor systems. In order to make the connection, thermal energy is supplied by a device 10'' from both sides of the structure.

The configuration of the perforations 6, 6' depends on the position of the connecting points in the multi-layer system. The connection between the conductor structures, instead of being made by thermal energy, may also be made, in each case, through the use of conductive masses.

The composite conductor systems according to the invention and the multi-layer system capable of being produced according to the invention can be obtained in a simple and cost-effective way. The connections which are made according to the invention between the individual layers are stable. Nevertheless, only a low energy input is required in order to make the connections. Melting of the carriers outside the connection regions is largely avoided since the connection energy can be supplied to the connecting point through the perforations in a controlled manner. Thermoplastic carriers may be used. Moreover, the structure of the composite conductor systems according to the invention allows the connection which is made to be checked visually. Furthermore, the passage orifices may serve as visual positioning and centering aids both during production and in the finished multilayer system.

I claim:

1. In a method for producing at least one electrically conductive connection between at least two conductor structures, at least one of the conductor structures disposed on at least one carrier to form at least one composite conductor system, the at least one carrier formed of thermoplastic synthetic material, and the at least one composite conductor system having perforations formed therein in the vicinity of contact points of the conductor structure, the improvement which comprises:

directly supplying thermal energy directed through the perforations for producing the electrically conductive connection at the contact points.

2. The method according to claim 1, which comprises introducing an electrically conductive mass into the perforations.

3. The method according to claim 1, which comprises introducing an electrically conductive mass selected from the group consisting of a conductive paste, a conductive adhesive, a solder paste and a solder foil, into the perforations.

4. The method according to claim 1, which comprises supplying the thermal energy by generating heat radiation in a manner selected from the group consisting of gap or close welding, soldering, ultrasound, thermocompression, thermosound and laser.

5. The method according to claim 1, which comprises integrating each of the conductor structures into a respective carrier.

6. The method according to claim 1, which comprises forming all of the carriers of a thermoplastic.

7. The method according to claim 5, which comprises forming all of the carriers of a thermoplastic.

8. The method according to claim 7, which comprises producing the composite conductor systems with differing thicknesses, and producing the connection in the vicinity of the perforations located in the thicker of the composite conductor systems.

9. The method according to claim 7, which comprises producing the composite conductor systems with differing thicknesses, and producing the connection in the vicinity of the perforations located in the thicker of the composite conductor systems.

10. In a method for producing an electrically conductive connection between a metallic leadframe integrated into a foil and at least one conductor structure disposed on a thermoplastic carrier to form at least one composite conductor system having perforations formed therein in the vicinity of contact points of the conductor structure, the improvement which comprises:

directly supplying thermal energy directed through the perforations for producing the electrically conductive connection at the contact points.

\* \* \* \* \*